(12) United States Patent
Boettiger

(10) Patent No.: US 7,675,080 B2
(45) Date of Patent: Mar. 9, 2010

(54) UNIFORM COLOR FILTER ARRAYS IN A MOAT

(75) Inventor: Ulrich C. Boettiger, Boise, ID (US)

(73) Assignee: Aptina Imaging Corp., George Town, Grand Cayman (KY)

( * ) Notice: Subject to any disclaimer, the term of this patent is extended or adjusted under 35 U.S.C. 154(b) by 760 days.

(21) Appl. No.: 11/328,152

(22) Filed: Jan. 10, 2006

(65) Prior Publication Data

US 2007/0158772 A1    Jul. 12, 2007

(51) Int. Cl.
*H01L 31/0232* (2006.01)
(52) U.S. Cl. .................. 257/98; 257/432; 257/E31.127
(58) Field of Classification Search .................... 257/98, 257/432, E31.127
See application file for complete search history.

(56) References Cited

U.S. PATENT DOCUMENTS

| | | | |
|---|---|---|---|
| 4,217,598 A * | 8/1980 | d'Auria et al. ................. 257/85 |
| 6,140,630 A | 10/2000 | Rhodes | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,529,239 B1 | 3/2003 | Dyck et al. | |
| 6,566,151 B2 | 5/2003 | Yeh et al. | |
| 7,193,289 B2 * | 3/2007 | Adkisson et al. ............. 257/431 |
| 7,265,328 B2 * | 9/2007 | Mouli ..................... 250/208.1 |
| 7,365,298 B2 | 4/2008 | Ryu | |
| 2004/0246351 A1 | 12/2004 | Hiatt et al. | |
| 2005/0101049 A1 * | 5/2005 | Kim ............................ 438/66 |
| 2008/0017945 A1 | 1/2008 | Wu et al. | |
| 2008/0116537 A1 | 5/2008 | Adkisson et al. | |
| 2008/0117319 A1 | 5/2008 | Jiang et al. | |
| 2008/0122960 A1 | 5/2008 | Liu et al. | |

FOREIGN PATENT DOCUMENTS

| | | |
|---|---|---|
| EP | 1 598 873 A1 | 11/2005 |
| EP | 1 705 706 A2 | 9/2006 |
| WO | WO 2006/060212 A1 | 6/2006 |

OTHER PUBLICATIONS

Mendis, et al., "CMOS Active Pixel Image Sensor", IEEE Transactions on Electron Devices, vol. 41, No. 3, Mar. 1994, pp. 452-453.
Nixon et al., "256x256 CMOS Active Pixel Sensor Camera-on-a-Chip", IEEE Journal of Solid-State Circuits, vol. 31, No. 12, Dec. 1996, pp. 2046-2050.

* cited by examiner

*Primary Examiner*—Allan R. Wilson
(74) *Attorney, Agent, or Firm*—Dickstein Shapiro LLP

(57) ABSTRACT

A method and apparatus for improving the planarity of a recessed color filter array when the recessed region or trench depth exceeds the thickness of the color filter film. The method includes the steps of coating the entire wafer with an additional coating material after applying the CFA, then planarizing that resist layer using CMP and then using a dry etch to transfer that planar surface down as far as required to achieve a planar color filter with a uniform thickness.

29 Claims, 9 Drawing Sheets

UNIFORM COLOR FILTER ARRAYS IN A MOAT

FIELD OF THE INVENTION

The invention relates generally to a solid state imaging device and more particularly to a method and apparatus to implement for reducing stack height of the solid state imaging device.

BACKGROUND OF THE INVENTION

There are a number of different types of semiconductor-based imagers, including charge coupled devices (CCD's), photodiode arrays, charge injection devices (CID's), hybrid focal plane arrays, and complementary metal oxide semiconductor (CMOS) imagers. Current applications of solid-state imagers include cameras, scanners, machine vision systems, vehicle navigation systems, video telephones, computer input devices, surveillance systems, auto focus systems, star trackers, motion detector systems, image stabilization systems, and other image acquisition and processing systems.

CMOS imagers are well known. CMOS images are discussed, for example, in Nixon et al., "256×256 CMOS Active Pixel Sensor Camera-on-a-Chip," IEEE Journal of Solid-State Circuits, Vol. 31(12), pp. 2046-2050 (1996); Mendis et al., "CMOS Active Pixel Image Sensors," IEEE Transactions on Electron Devices, Vol. 41(3), pp. 452-453 (1994); and are also disclosed in U.S. Pat. Nos. 6,140,630, 6,204,524, 6,310,366, 6,326,652, 6,333,205, and 6,326,868; assigned to Micron Technology, Inc., the entire disclosures of which are incorporated herein by reference.

Solid state imaging devices include an array of pixel cells, which converts light energy received, through an optical lens, into electrical signals. Each pixel cell contains a photosensor for converting a respective portion of a received image into an electrical signal. The electrical signals produced by the array of photosensors are processed to render a digital image.

In a CMOS imager, the active elements of a pixel cell perform the necessary functions of: (1) photon to charge conversion; (2) accumulation of image charge; (3) transfer of charge to a floating diffusion region accompanied by charge amplification; (4) resetting the floating diffusion region to a known state; (5) selection of a pixel cell for readout; and (6) output and amplification of a signal representing the pixel cell charge. Photo-charge may be amplified when it moves from the initial charge accumulation region to the floating diffusion region. The charge at the floating diffusion region is typically converted to a pixel output voltage by a source follower output transistor.

To detect color, the spectral components of incident light must be separated and collected. An absorptive color filter array (CFA) on top of an imager chip is currently the dominant technology for color detection in a solid state imager, for example, a CCD or CMOS imager. In a typical imager layout, a micro-lens and CFA is stacked as part of a pixel stack. In an effort to reduce the pixel stack height and bring the micro-lens and CFA closer to the photosensor, the CFA can be lowered into a recessed area within the imager. However, the problem exists that if the recess depth exceeds the thickness of the CFA film, the typical method of planarizing, i.e., chemical mechanical planarization (CMP), is no longer directly applicable to improve the planarity of the CFA on the pixel array.

There is needed, therefore, another method and apparatus providing a uniform color filter array within a recessed area in an imager for situations when the recessed area depth exceeds the thickness of the CFA film and improving the planarity of a recessed CFA.

BRIEF SUMMARY OF THE INVENTION

The invention provides a method and apparatus for improving the planarity of a recessed CFA on the pixel array having a recessed region. The inventive method comprises the steps of forming a plurality of fabricated layers over a photo-conversion device; etching a trench into at least one of said plurality of fabricated layers; applying color filters into a portion of the trench; filling the remainder of the trench with a photoresist material; planarizing the photoresist material surface; and etching back the photoresist material and color filters until there is a uniform thickness in the color filter. If required, the etch can be masked by a suitable resist mask, protecting the passivation layer around the recessed region.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1:
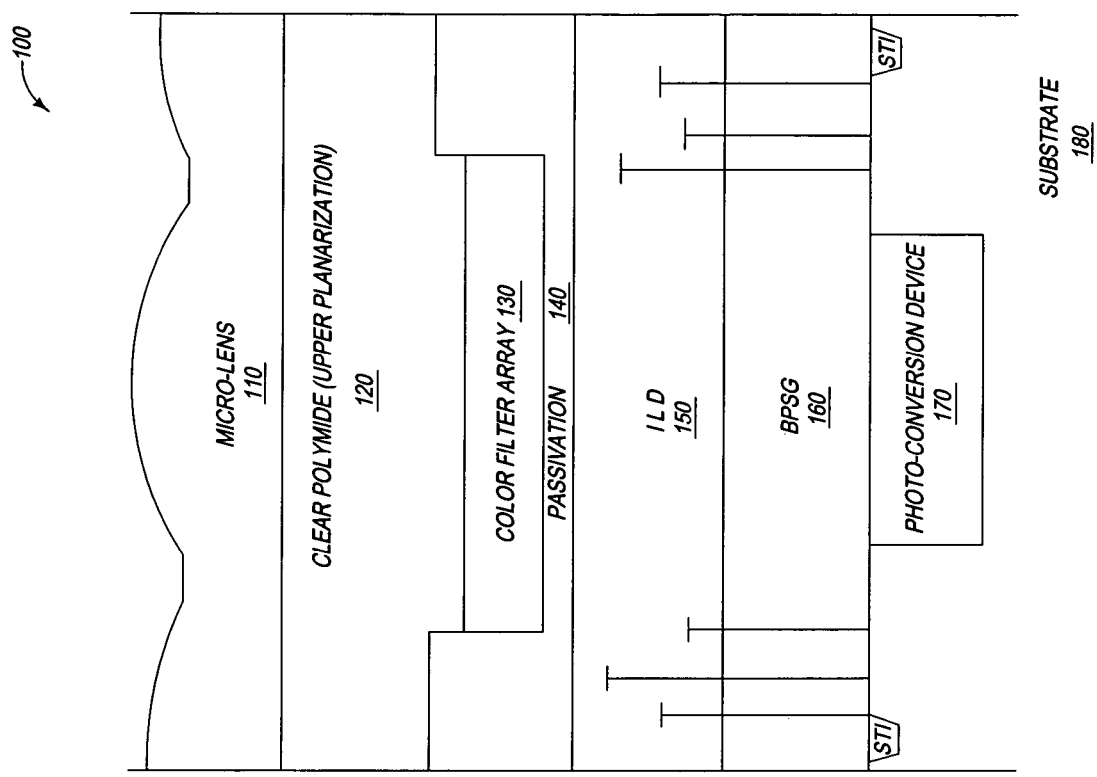
FIG. 1 shows a cross sectional view of the image sensor pixel array constructed in accordance with the exemplary embodiment of the invention.

In the following detailed description, reference is made to the accompanying drawings which form a part hereof, and in which is shown by way of illustration specific embodiments by which the invention may be practiced. It should be understood that like reference numerals represent like elements throughout the drawings. These exemplary embodiments are described in sufficient detail to enable those skilled in the art to practice the invention. It is to be understood that other embodiments may be utilized, and that structural, logical and electrical changes may be made without departing from the spirit and scope of the present invention.

The terms "wafer" and "substrate" are to be understood as including all forms of semiconductor wafers and substrates including, silicon, silicon-on-insulator (SOI), silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or above the base semiconductor structure or foundation. In addition, the semiconductor need not be silicon-based, but could be based on other semiconductors, for example, silicon-germanium, germanium, or gallium arsenide.

The term "pixel" refers to a picture element unit cell containing circuitry including a photosensor and semiconductors for converting electromagnetic radiation to an electrical signal. For purposes of illustration, fabrication of a representative pixel is shown and described. Typically, fabrication of all pixels in an imager will proceed simultaneously in a similar fashion. The following detailed description is, therefore, not to be taken in a limiting sense, and the scope of the present invention is defined by the appended claims.

Although the invention is described herein with reference to the architecture and fabrication of one or a limited number of pixels, it should be understood that this is representative of a plurality of pixels as typically would be arranged in an imager array having pixel cells arranged in an array, for example, an array of pixel rows and columns.

In addition, although the invention is described below with reference to a pixel array for a CMOS imager, the invention has applicability to all solid-state imaging devices using pixels (e.g., a CCD imager).

The invention may also be employed in display devices where a pixel has a light emitter for emitting light. The following detailed description is, therefore, not to be taken in a limiting sense, and the scope of the present invention is defined only by the appended claims.

Color filters in a trench recess are beneficial for reduced stack height and improved pixel optics. The recessed color filter array provides an improved acceptance angle range for incoming light, reducing optical crosstalk. The recessed color filter array essentially places the micro-lens and color filter substantially closer to the photosensor, thus reducing the amount of diffracted or misdirected light reaching neighboring pixels. However, if the color filter array thickness, while recessed, is less than the depth of the trench, effective planarization by CMP is not possible.

FIG. 1 shows a cross sectional view of an image sensor pixel array constructed in accordance with an exemplary embodiment of the invention. The image sensor 100 comprises a photo-conversion device 170, a micro-lens 110, and a plurality of fabricated layers between the photo-conversion device 170 and the micro-lens 110. The photo-conversion device could include a photosensor, which receives light and generates an electrical signal or a photo emitter, which receives an electrical signal and generates light. The plurality of fabricated layers typically include a clear polymide planarization layer 120, a color filter array layer 130, a silicon nitride passivation layer 140, a plurality of interlayer dielectric layers 150 and associated metallization layers, and a boron-phosphorous glass layer (BPSG) 160. The color filter array 130 is recessed into a trench 190 in a passivation layer 140. The color filter array 130 thickness is less than the depth of the trench 190.

Figure 2:
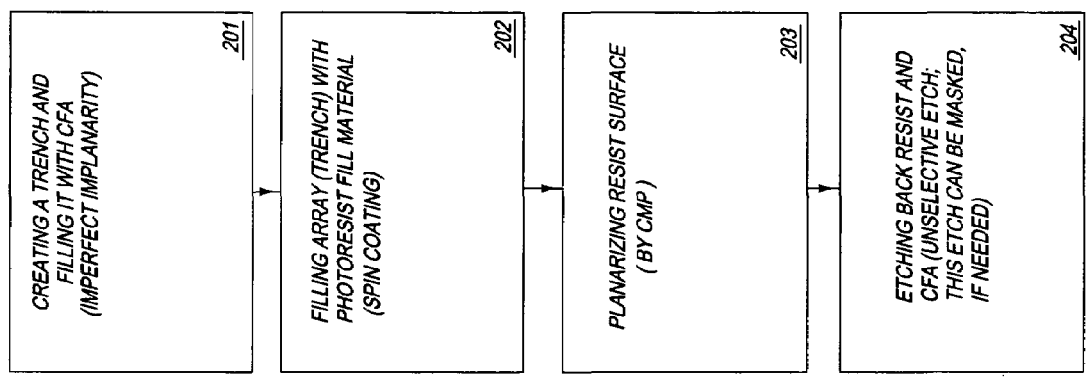
FIG. 2 is a block diagram of the method containing the steps related to the color filter array forming process, according to an exemplary embodiment of the invention.

FIG. 2 is a flow chart of a method for forming a color filter array according to the invention. FIGS. 2A-2D illustrate the FIG. 1 structure prior to formation of an upper planarization layer 120 and micro-lens layer 110.

Figure 2A:
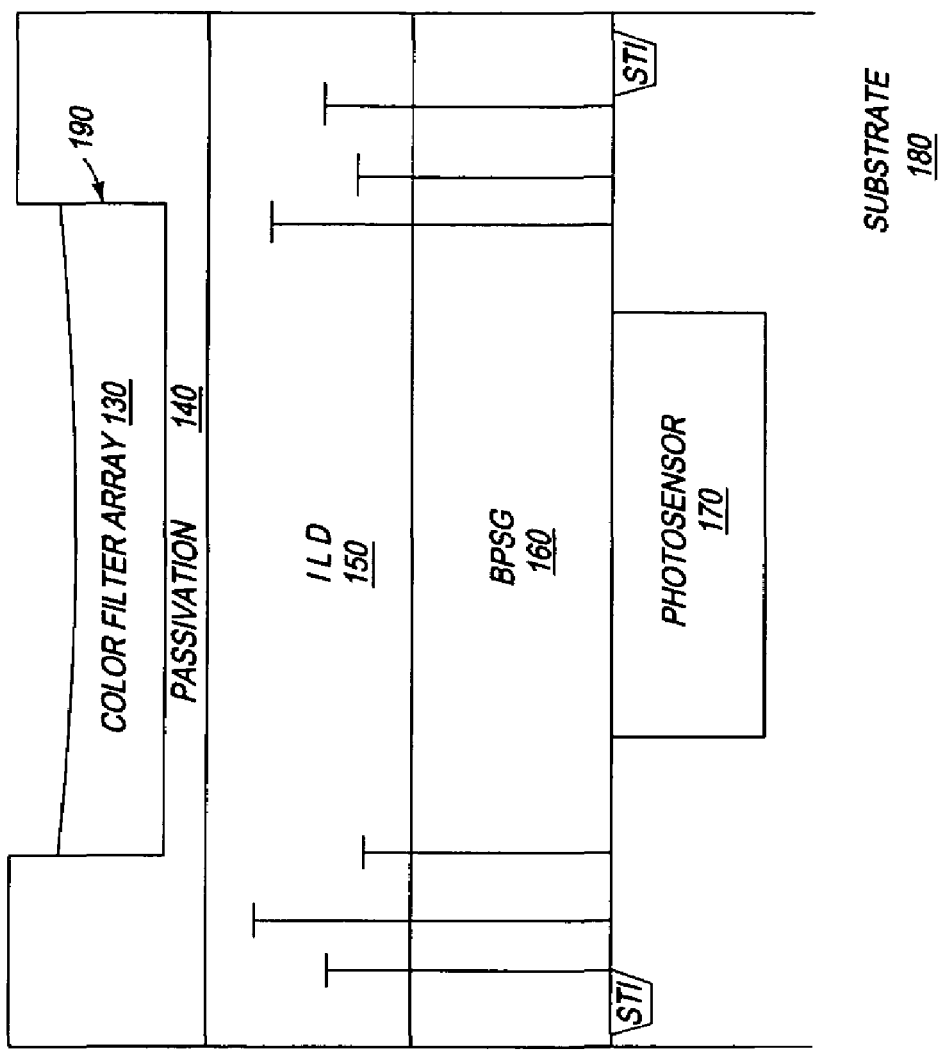
FIG. 2A shows the color filter array structure in accordance with the first step of the exemplary embodiment of the invention.

FIG. 2A shows a photosensor 170 in a substrate 180. Over that is BPSG layer 160, which is below one or more interlayer dielectric layers 150 and associated metallization layers. Above the uppermost interlayer dielectric layer 150 can be a passivation layer 140, e.g., a silicon nitride layer. According to an exemplary embodiment of the invention, in step 201, and referring to FIGS. 2 and 2A, a trench 190 is created in the passivation layer 140 above the photosensor 170, which is filled partially with a color filter material 130. The trench 190 may also be etched through passivation layer 140, ILD and associated metallization layers 150 and partially into the BPSG layer 160. The color filter array 130 thickness is less than the depth of the trench 190. At this stage, the color filter array 130 will have imperfect planarity. The color filter array 130 can be any thickness between a thin layer above the surface of the bottom of the trench 190 and filling the depth of the trench 190 completely.

Figure 2B:
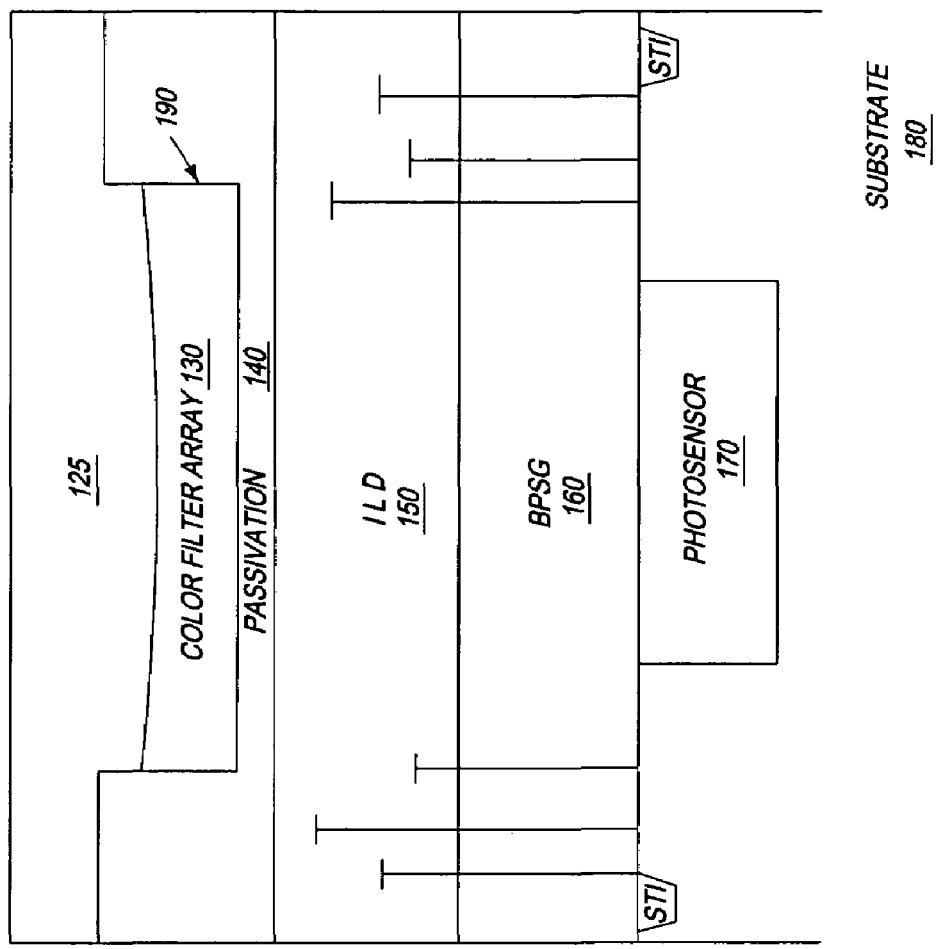
FIG. 2B shows the color filter array structure in accordance with the second step of the exemplary embodiment of the invention.

Next, referring also to FIG. 2B, in step 202 any remaining trench above the color filter array 130 is filled with a fill material 125 such as a photoresist material. The photoresist material 125 can be a spin coated material but can be deposited as well. The photoresist material 125 fills the trench 190 until the material 125 exceeds the depth of the trench 190.

Figure 2C:
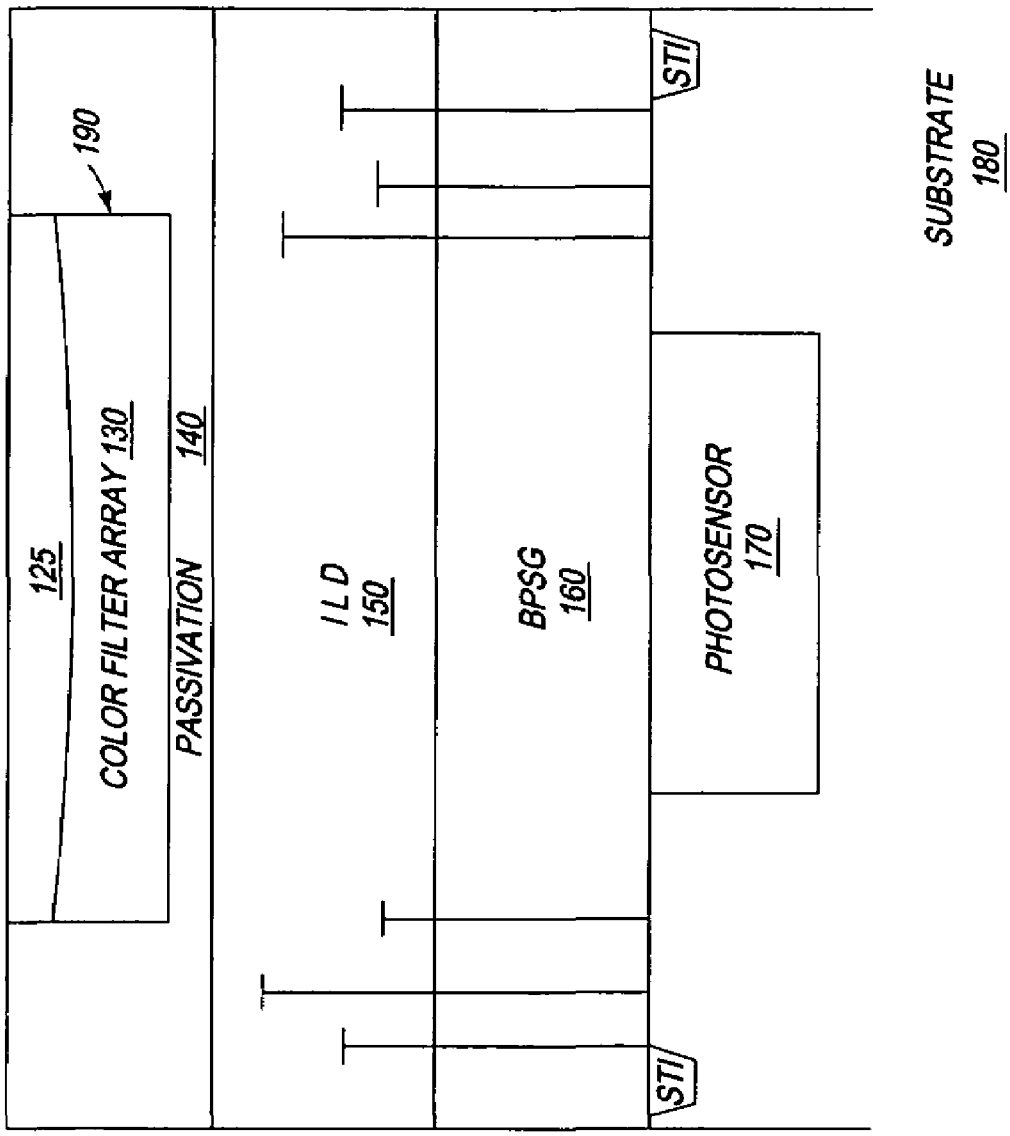
FIG. 2C shows the color filter array structure in accordance with the third step of the exemplary embodiment of the invention.

Then in step 203, referring also to FIG. 2C, the resist material 125 surface is planarized to the top surface of the passivation layer 140. The preferred method for planarizing the resist material 125 surface is CMP. However, any of a number of other methods for planarizing already known in the art can be used.

Figure 2D:
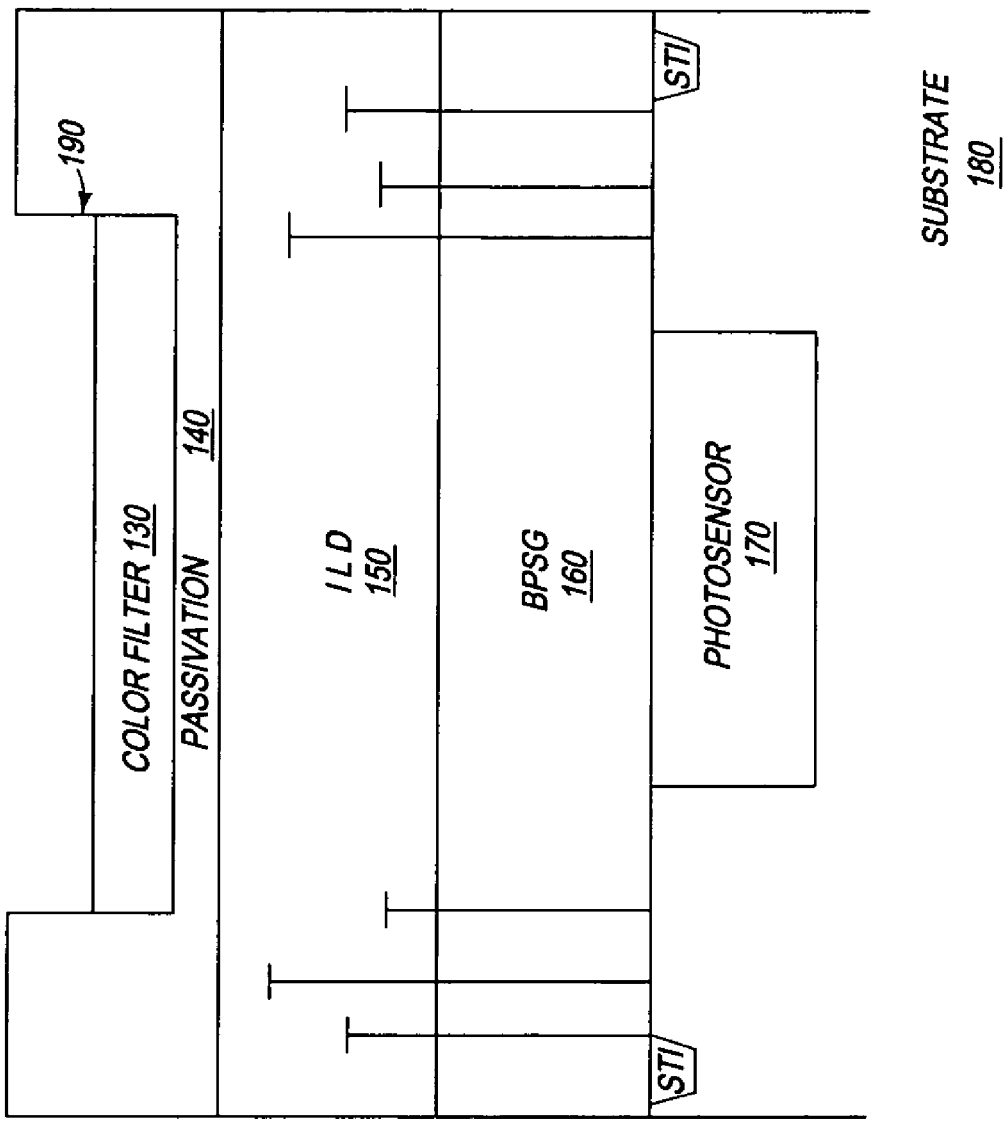
FIG. 2D shows the color filter array structure in accordance with the fourth step of the exemplary embodiment of the invention.

Finally, referring to FIG. 2D, in step 204 the resist material 125 and color filter array 130 are dry etched back to form a planarized CFA surface. After the etch process, the thickness of the color filter array 130 will be uniform and is less than the depth of the trench 190. The resist material 125 and color filter array 130 can also be etched back by any method known in the art, e.g., wet etch. The preferred method is an unselective dry etch. It should be appreciated that the etch can be masked, if needed, by a suitable resist mask. By masking the etch, the passivation layer around the recessed area can be protected. After the etch, the optional upper planarization layer 120 and the micro-lens layer 110 are added.

By recessing the color filters in a trench, a reduced stack height can be obtained and the lens 110 can be located closer to the photo-conversion device 170. The recessed color filter helps reduce optical crosstalk due to diffracted or misdirected light, effectively increasing the angular acceptance range for incoming light and reducing color artifacts.

Figure 3:
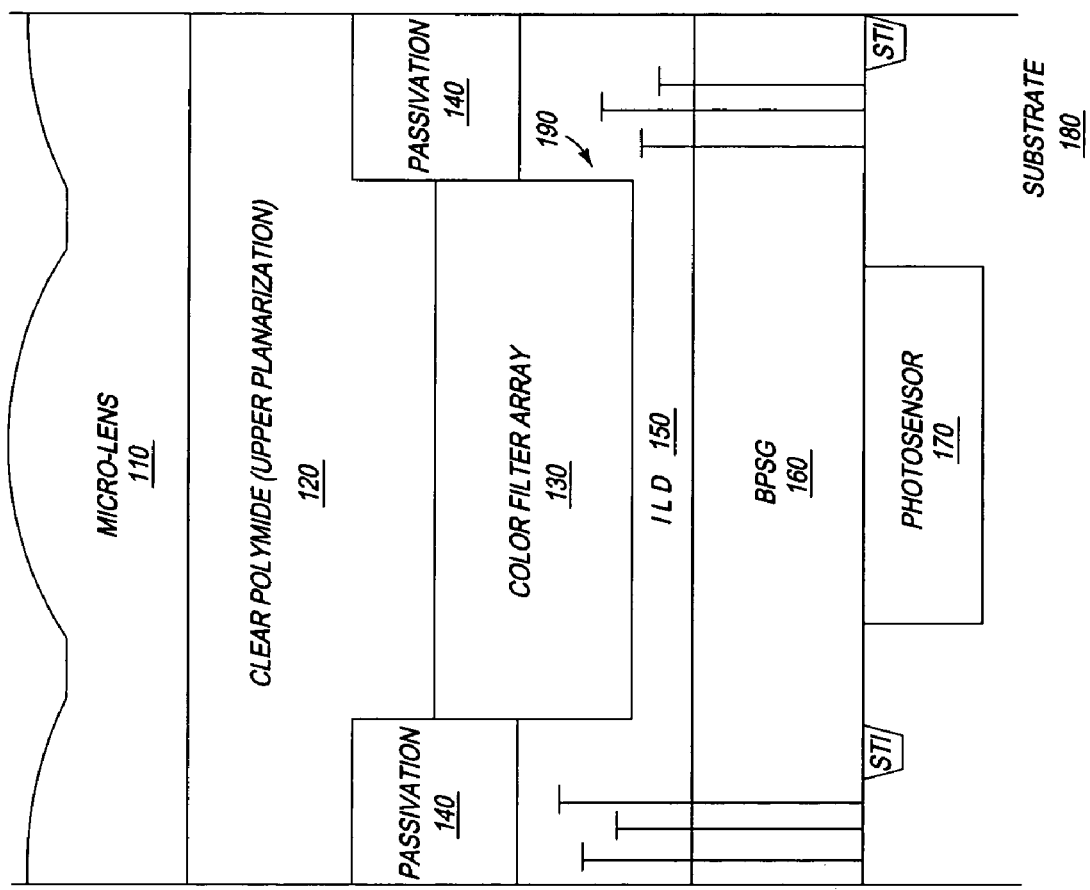
FIG. 3 shows a cross sectional view of the image sensor pixel constructed in accordance with another exemplary embodiment of the invention.

It should be appreciated that in the exemplary embodiment discussed above the trench 190 has been described as recessed into the passivation layer 140, however the trench 190 may be recessed from or continue into additional layers, i.e., a plurality of fabricated layers, e.g., layers 150, 160. For example referring to FIG. 3, trench 190 may begin at the level of micro-lens layer 110, or at the level of upper planarization layer 120 and continue downward through the passivation layer 140 into the interlayer dielectric layers 150 and associated metallization layers. In other words, the trench 190 may recess through any other layer included within the image sensor 100 between the photosensor layer 170 and the micro-lens layer 110. The invention may be used in solid state imagers employing various kinds of photosensors formed on a substrate in photosensor layer, including but not limited to photodiodes, photo transistors, photoconductors, and photogates.

Figure 4:
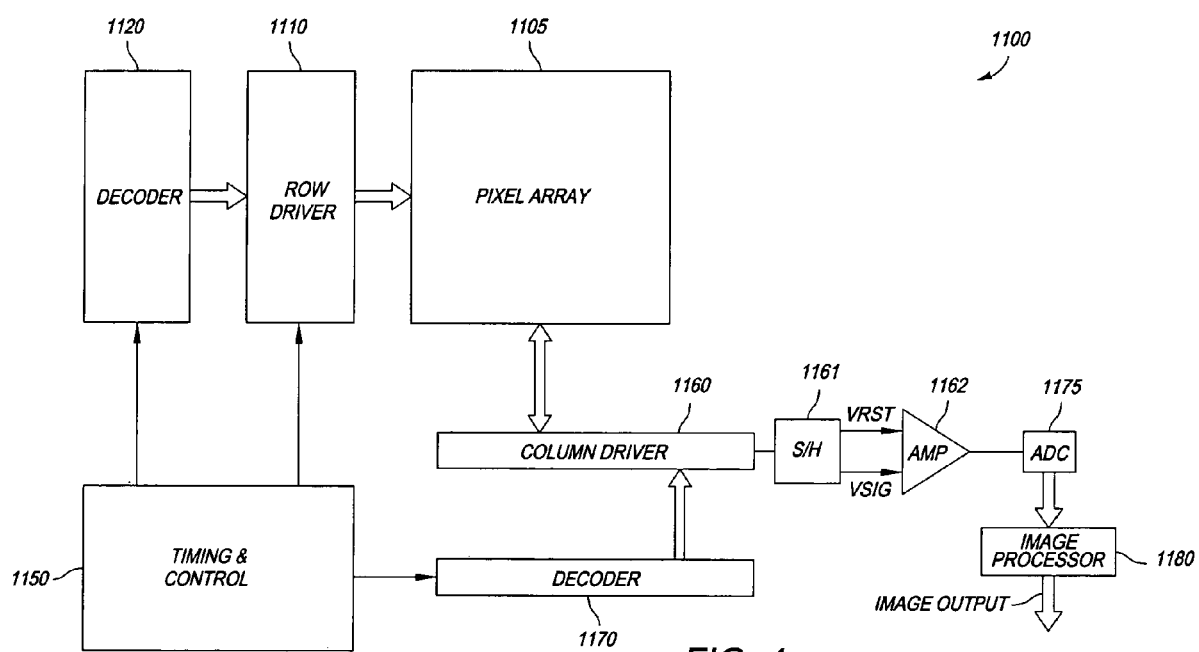
FIG. 4 shows a CMOS image sensor constructed in accordance with the exemplary embodiment of the invention.

FIG. 4 illustrates an exemplary CMOS imager 1100 that may utilize the invention. The CMOS imager 1100 has a pixel array 1105 comprising pixels constructed to include the recessed color filter array in accordance with the invention. The CMOS pixel array 1105 circuitry are conventional and are only briefly described herein. Array row lines are selectively activated by a row driver 1110 in response to row address decoder 1120. A column driver 1160 and column address decoder 1170 are also included in the imager 1100. The imager 1100 is operated by the timing and control circuit 1150, which controls the address decoders 1120, 1170.

A sample and hold circuit 1161 associated with the column driver 1160 reads a pixel reset signal Vrst and a pixel image signal Vsig for selected pixels. A differential signal (Vrst-Vsig) is amplified by differential amplifier 1162 for each pixel and is digitized by analog-to-digital converter 1175 (ADC). The analog-to-digital converter 1175 supplies the digitized pixel signals to an image processor 1180 which forms a digital image.

Figure 5:
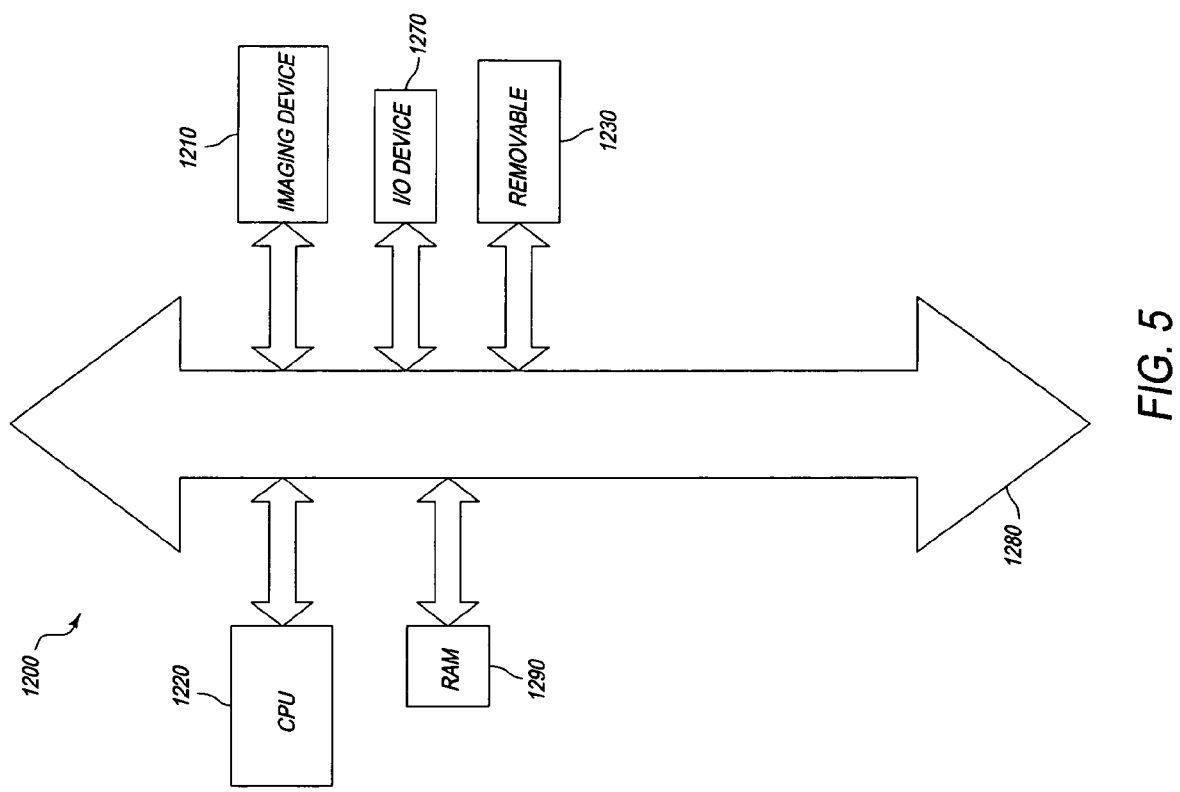
FIG. 5 shows a processor system incorporating at least one imager constructed in accordance with the exemplary embodiment of the invention.

FIG. 5 shows a processor system 1200 which includes an imaging device 1210 (such as the imaging device 1100 illustrated in FIG. 3) of the invention. The processor system 1200 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other systems employing an image sensor.

System 1200, for example a camera system, generally comprises a central processing unit (CPU) 1220, such as a microprocessor, that communicates with an input/output (I/O) device 1270 over a bus 1280. Imaging device 1210 also communicates with the CPU 1220 over the bus 1280. The processor system 1200 also includes random access memory (RAM) 1290, and can include removable memory 1230, such as flash memory, which also communicate with the CPU 1220 over the bus 1280. The imaging device 1210 may be combined with a processor, such as a CPU, digital signal processor, or microprocessor, with or without memory storage on a single integrated circuit or on a different chip than the processor.

It should also be appreciated that the imager device 1100 of the claimed invention may also be used within display imager devices having light emitters fabricated on a substrate rather than photosensors.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

The invention claimed is:

1. A pixel comprising:
  a photo-conversion device formed within a substrate;
  a lens over said photo-conversion device;
  a plurality of fabricated layers between said photo-conversion device and lens, the plurality of fabricated layers comprising at least a planarization layer, which extends to other pixels and which supports the lens, and at least one other layer between the planarization layer and the substrate;
  a trench having a depth and being formed at a location between said planarization layer and photo-conversion device and in at least the at least one other layer; and
  a color filter having a uniform thickness recessed in said trench, the uniform thickness being less than the depth of said trench.

2. The pixel of claim 1, wherein said photo-conversion device is a photosensor.

3. The pixel of claim 1, wherein said photo-conversion device is a photo emitter.

4. The pixel of claim 1, wherein said color filter extends from a layer below a layer of said planarization layer to a layer above said substrate.

5. The pixel of claim 4, wherein said layer below the level of said planarization layer comprises a passivation layer.

6. The pixel of claim 4, wherein said layer above said substrate comprises a boron-phosphorous silicon glass layer.

7. The pixel of claim 1, wherein said color filter is a part of a color filter array comprising a plurality of color filters.

8. The pixel of claim 1, wherein the at least one other layer comprises at least one of a passivation layer, a dielectric layer, and a boron-phosphorous silicon glass layer.

9. The pixel of claim 8, wherein the at least one other layer is a passivation layer.

10. A pixel comprising:
  a photo-conversion device formed within a substrate;
  a lens over said photo-conversion device;
  a plurality of fabricated materials between said photo-conversion device and lens, the plurality of fabricated materials comprising at least a planarization material, which extends to other pixels and which supports the lens, and at least one other material between the planarization material and the substrate;
  a trench having a depth and being formed in the at least one other material; and
  a color filter material having a uniform thickness recessed within said trench, the uniform thickness being less than the depth of said trench.

11. The pixel of claim 10, wherein said photo-conversion device is a photosensor.

12. The pixel of claim 10, wherein said photo-conversion device is a photo emitter.

13. The pixel of claim 11, wherein the color filter material is part of a color filter array comprising a plurality of color filters.

14. The pixel of claim 10, wherein the at least one other material comprises a passivation material.

15. The pixel of claim 14, wherein the at least one other material further comprises a dielectric material and a boron-phosphorous silicon glass material.

16. An image sensor comprising:
  at least one pixel comprising:
    a photo-conversion device formed within a substrate;
    a lens over said photo-conversion device; and
    a plurality of fabricated materials between said photo-conversion device and lens, the plurality of fabricated materials comprising at least a planarization material, which extends to other pixels and which supports the lens, and at least one other material between said planarization material and the substrate;
    a trench having a depth and being formed in at least the at least one other material between said planarization material and said photo-conversion device; and
    a color filter material having a uniform thickness recessed within said trench, the uniform thickness being less than the depth of said trench.

17. The image sensor of claim 16, wherein said photo-conversion device is a photosensor.

18. The image sensor of claim 16, wherein said photo-conversion device is a photo emitter.

19. The image sensor of claim 16, wherein the color filter material is part of a color filter array comprising a plurality of color filters.

20. The image sensor of claim 16, wherein the at least one other material comprises a passivation material, and the trench and color filter material are formed within the passivation material.

21. An image sensor comprising:
a pixel array comprising:
a plurality of photosensors formed within a substrate;
a plurality of lenses, each respectively located over a respective photosensor;
a plurality of fabricated layers between said plurality of photosensors and said plurality of lenses, the plurality of fabricated layers comprising at least a planarization layer, and at least one other layer;
a plurality of trenches of a depth formed in at least the at least one other layer located between a respective lens and a respective photosensor; and
a plurality of color filters, each having a uniform thickness less than the depth of said plurality of trenches and being recessed within a respective trench, said plurality of color filters including color filters for different colors.

22. The image sensor of claim 21, wherein the at least one other layer comprises a passivation layer.

23. The image sensor of claim 21, wherein the at least one other layer comprises a passivation layer and a dielectric layer.

24. The image sensor of claim 21, wherein the at least one other layer comprises a passivation layer or a dielectric layer.

25. The image sensor of claim 24, wherein the planarization layer is a layer below the plurality of lenses, the passivation layer is a layer below the planarization layer, and the boron-phosphorous silicon glass layer is a layer above the substrate.

26. A system comprising:
a processor coupled to an image sensor, said image sensor comprising:
at least one pixel comprising:
a photo-conversion device formed within a substrate;
a lens over said photo-conversion device;
a plurality of fabricated layers between said photo-conversion device and lens, partially formed in one of said plurality of fabricated layers, the plurality of fabricated layers comprising at least a planarization layer, and at least one other material;
a trench having a depth and being formed in at least the at least one other material at a location between said at least one other material and said photo-conversion device; and
a color filter having a uniform thickness recessed within said trench, the uniform thickness being less than the depth of said trench.

27. The system of claim 26, wherein said photo-conversion device is a photosensor.

28. The system of claim 26, wherein said photo-conversion device is a photo emitter.

29. The system of claim 26, wherein the color filter is part of a color filter array comprising a plurality of color filters.

\* \* \* \* \*